United States Patent [19]

Friman

[11] Patent Number: 4,920,444

[45] Date of Patent: Apr. 24, 1990

[54] ARRANGEMENT FOR DECOUPLING INTEGRATED CIRCUITS ELECTRICALLY

[75] Inventor: Alf Friman, Växjö, Sweden

[73] Assignee: Carmis Enterprises S.A., Geneva, Switzerland

[21] Appl. No.: 251,640

[22] Filed: Oct. 3, 1988

[30] Foreign Application Priority Data

Oct. 9, 1987 [SE] Sweden .................................. 8703913

[51] Int. Cl.[5] .............................................. H08H 3/20
[52] U.S. Cl. ...................................... 361/56; 361/306;
174/52.4; 357/74
[58] Field of Search .................... 307/239, 246; 361/17,
361/54, 56, 57, 206 DC; 357/23.6, 74, 70;
174/52.4

[56] References Cited

U.S. PATENT DOCUMENTS 4,497,105  2/1985  Uemura ............................ 361/433 X
4,598,307  7/1986  Wakabayashi et al. ................ 357/75
4,626,958  12/1986  Lockard et al. ............. 361/306 DC
4,636,918  1/1987  Jodoin ................................. 361/405

FOREIGN PATENT DOCUMENTS 2152753  11/1984  United Kingdom .

Primary Examiner—Derek S. Jennings
Attorney, Agent, or Firm—Sughrue, Mion, Zinn, Macpeak & Seas

[57] ABSTRACT

An arrangement for electrically decoupling IC-circuits by means of decoupling capacitors. A particularly simple and effective electical decoupling of such circuits is achieved by mounting, e.g. gluing, a metal foil (2) on the circuit. The earth connection (3) of the circuit is connected to the edge of the foil through a short conductor and each of the signal output (4) and supply conductor (5) is connected directly to the foil edge through a respective soldered chip capacitor (7, 8).

3 Claims, 3 Drawing Sheets

ARRANGEMENT FOR DECOUPLING INTEGRATED CIRCUITS ELECTRICALLY

The present invention relates to an arrangement for decoupling integrated circuits electrically with the aid of decoupling capacitors connected between earth/signal outputs and/or earth/supply lines.

Troublesome interference occurs when a large number of fast acting integrated circuits, so-called IC-circuits, are connected together to a unit, e.g. a computer or data processor. For example, the functioning of the equipment is, on the one hand, disturbed by surrounding influences, such as other computers, radio receivers, TV-apparatus and, on the other hand, the equipment itself has a disturbing influence on such peripheral apparatus and equipment, thereby producing erroneous results or no result at all. The interference referred to here is an electromagnetic interference (EMI), which may be radiating or conductor-bound.

In addition to the problems which are manifested solely as interference, there is also a danger that the equipment will emit signals which can be captured at locations distanced from the equipment itself and utilized to obtain unauthorized or classified information, so-called revealing signals.

All of these problems are well known in the art. Thus, the surroundings can be shielded from these signals, by metal-encapsulation of the equipment involved and by filtering the input and output signals. Such metal encapsulation becomes very expensive and difficult to effect, however, when the equipment concerned includes displays, visual display screens, keyboards, etc. Furthermore, encapsulation does not assist against interference internally of the equipment. In order to safeguard against internal interference, it is standard practice to include a capacitor between the supply voltage and earth on a circuit board or card in the case of IC-circuits.

This solution is also encumbered with a number of drawbacks, however. For example, the solution is not particularly effective and does not assist against signals of a revealing nature or EMI. Furthermore, the devices required herefor require too much space in compact equipment.

Other solutions, exhaustively described in the literature, include the use of ferrite filters, ferrite plates, multilayer circuit board and flat capacitors for fitting above or beneath IC-circuits. A further possibility is that of mounting one or more capacitors in a dense array above an IC-circuit. This solution is also inefficient, however.

None of the known solutions is sufficiently effective or simple enough for efficient application, particularly not to existing equipment.

Consequently, an object of the present invention is to provide a simple, inexpensive and effective solution to the problem of decoupling IC-circuits electrically.

This object is achieved in accordance with the invention by covering at least the major part of the under-surface or over-surface of such an IC-circuit with a metal foil which is connected to the earth connection of the circuit by means of a short conductor extending to the edge of the foil and with the signal outputs and/or supply conductor of the circuit also connected to the edges of the foil, via the decoupling capacitors. A decoupler of this kind can be easily constructed. The metal foil may, advantageously, be glued to one side of the IC-circuit, level with the edge surfaces thereof, and to this end may be self-adhesive. Connection of the decoupling capacitors then becomes highly practicable and easy to carry out, particularly when one or more of these capacitors consist of chip capacitors soldered between, on the one hand, respective signal outputs or the supply conductor and, on the other hand, adjacent points on the foil edge.

Decoupling of an integrated circuit in accordance with the invention fulfills all of the criteria upon which effective decoupling depends, such as the presence of short and broad supply conductors so as to obtain a low series inductance, supply-voltage and signal-voltage application surfaces of small dimensions (small areas, short lengths), smallest possible loop area, low capacitor losses and low impedance of the earthing surface. The effect produced by the present invention can be confirmed in practice, suitably by carrying out comparison tests, as recited in the following description.

The invention will now be described in more detail with reference to the accompanying drawing, which illustrates schematically an exemplifying embodiment of the inventive arrangement and test apparatus with associated result curves. More specifically:

Figure 1:
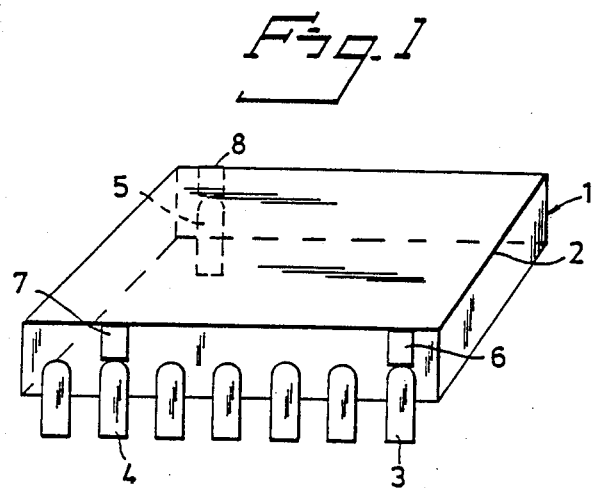
FIG. 1 is a perspective view of an IC-circuit according to the invention.

In the embodiment illustrated in FIG. 1, an IC-circuit in the form of a conventional elongated capsule 1 which has a sheet of copper foil 2 firmly glued to the upper surface thereof. The connecting legs of the capsule are arranged along the two long sides of the capsule, wherewith the leg 3 is earthed and the leg 4 is an output. A voltage supply leg 5 is arranged on the hidden side of the capsule. The earthed leg 3 is connected to the edge of the foil 2 by means of a very short firmly soldered conductor 6, and the output leg 4 is connected to the edge of said foil through a firmly welded chip capacitor 7. The voltage supply leg 5 is connected to the edge of the foil through a further chip capacitor 8.

Figure 2:
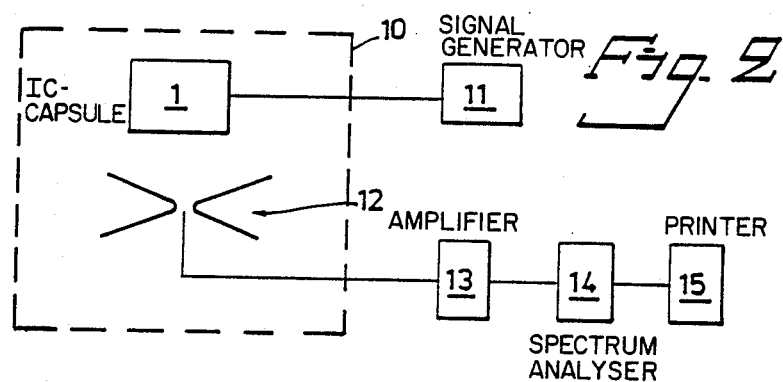
FIG. 2 is a diagrammatic illustration of test apparatus.

In the diagrammatic FIG. 2 illustration, an IC-capsule 1 is located in a screened room 10. The capsule 1 is connected to a signal generator 11. Also located in the screened room is a biconcave-antenna 12, which is connected to an antenna amplifier 13, a spectrum analyser 14 and a printer 15.

Figure 3:
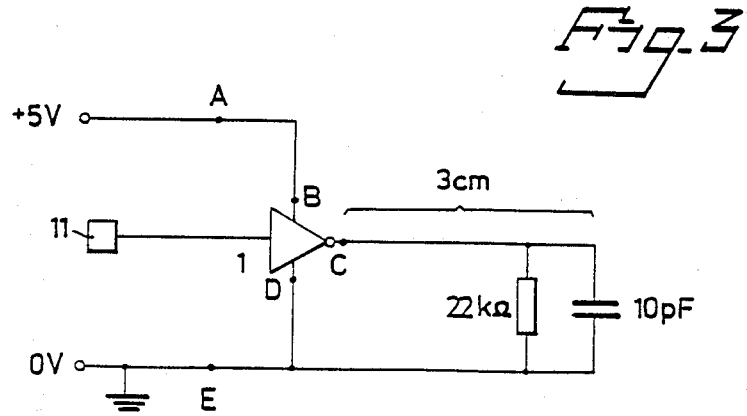
FIG. 3 is a circuit diagram of the tested IC-circuit with connections.

The IC-circuit 1 illustrated in FIG. 3 has marked thereon five points A–E, of which points A and E represent points on a circuit board adjacent the capsule 1 and the points B, C, D are points located directly on the capsule legs.

The following measurements were made with a capacitor of 150 nF coupled between A and E.

Figure 4:
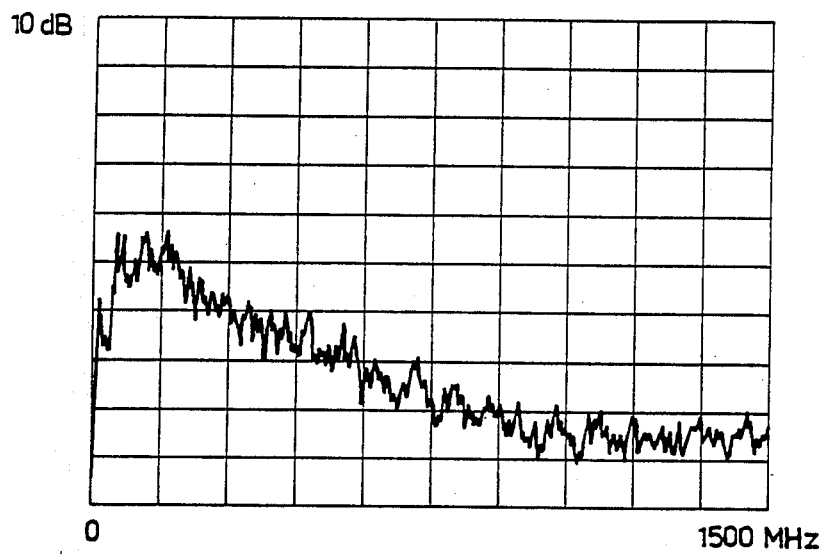
FIGS. 4, 5, 6 and 7 illustrate curves obtained in the tests.

1. No additional measures taken, corresponding to the normal situation in a computer e.g. max EMI-level 56 dB (FIG. 4)

Figure 5:
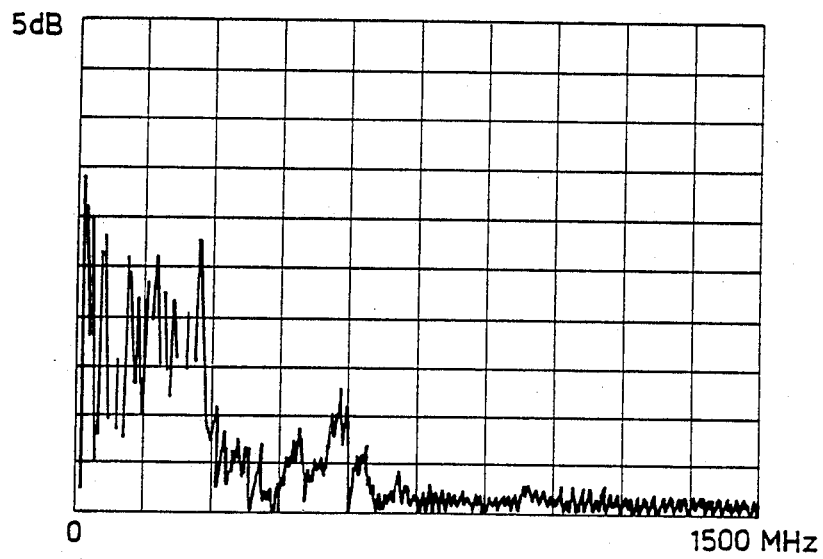

2. 100 nF+4.7 nF between BoO: max EMI-level 34 dB 47 nF+4.7 nF between CoD (FIG. 5).

Figure 6:
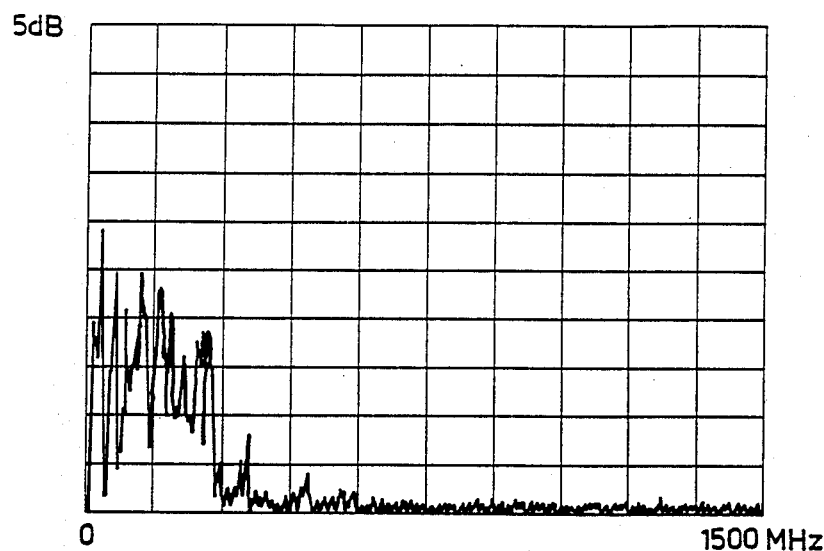

3. As 2+ferrite plate max EMI-level 28 dB (FIG. 6)

Figure 7:
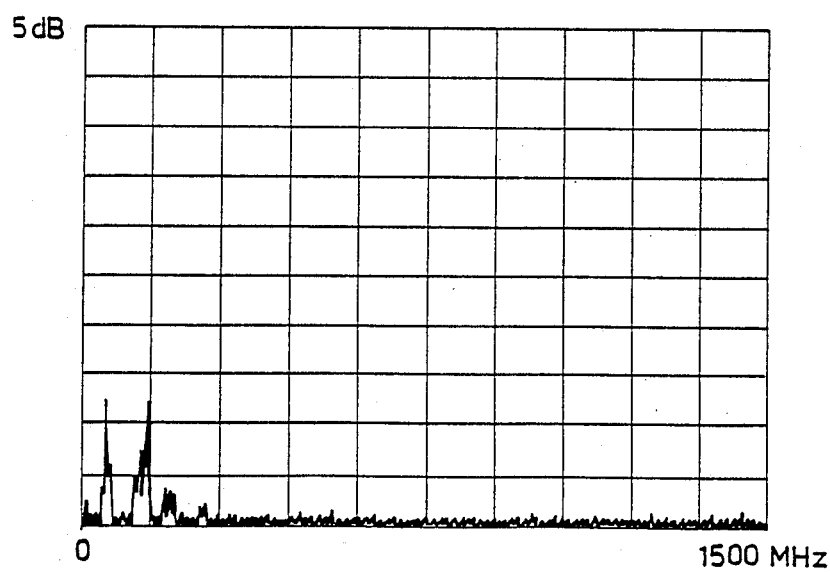

4. Chip capacitor 100 nF between BoD max EMI-level 13 dB Chip capacitor 47 nF between CoD. and copper foil mounted in accordance with the description (FIG. 7).

As will be seen from FIGS. 4–6 and FIG. 7, there is a considerable difference between the conventional arrangements according to 1-3 above and the inventive arrangement represented by 4.

What is claimed is:

1. An arrangement for electrically decoupling integrated circuits (1) by means of decoupling capacitors located between an earth connection (3) and at least one of a signal output (4) and a supply conductor (5), characterized in that at least the major part of an upper surface or a bottom surface of such an integrated circuit (1) is covered with a metal foil (2) which is connected at an edge to the earth connection (3) of the circuit by means of a short conductor (6), and to at least one of said circuit signal output (4) and said supply conductor (5) via the decoupling capacitors (7, 8) which are also connected to the foil edges.

2. An arrangement according to claim 1, characterized in that one or more of the decoupling capacitors is/are chip capacitors (7, 8) soldered between, on the one hand, respective signal outputs (4) or supply conductor (5) and, on the other hand, adjacent points on the foil edge.

3. An arrangement according to claim 1 or 2, characterized in that the metal foil (2) is glued to one side of the integrated circuit (1) flush with the edges of said one side.

* * * * *